United States Patent
Miyagi et al.

(10) Patent No.: US 6,858,946 B2
(45) Date of Patent: Feb. 22, 2005

(54) SEMICONDUCTOR DEVICE

(75) Inventors: Hiroshi Miyagi, Jouestu (JP); Akira Okamoto, Jouetsu (JP)

(73) Assignee: Niigata Seimitsu Co., Ltd., Niigata (JP)

( * ) Notice: Subject to any disclaimer, the term of this patent is extended or adjusted under 35 U.S.C. 154(b) by 0 days.

(21) Appl. No.: 10/482,012

(22) PCT Filed: Jun. 26, 2002

(86) PCT No.: PCT/JP02/06400

§ 371 (c)(1),
(2), (4) Date: Dec. 23, 2003

(87) PCT Pub. No.: WO03/010824

PCT Pub. Date: Feb. 6, 2003

(65) Prior Publication Data

US 2004/0173911 A1 Sep. 9, 2004

(30) Foreign Application Priority Data

Jul. 25, 2001 (JP) .................................... 2001-224893

(51) Int. Cl.$^7$ .............................................. H01L 23/48
(52) U.S. Cl. ..................... 257/786; 257/784; 257/773
(58) Field of Search ................................. 257/786, 773, 257/784

(56) References Cited

U.S. PATENT DOCUMENTS

| | | | | |
|---|---|---|---|---|
| 3,795,845 A | * | 3/1974 | Cass et al. | 257/786 |
| 4,974,053 A | * | 11/1990 | Kinoshita et al. | 257/666 |
| 5,338,971 A | * | 8/1994 | Casati et al. | 257/666 |
| 6,091,140 A | * | 7/2000 | Toh et al. | 257/691 |
| 6,365,978 B1 | * | 4/2002 | Ibnabdeljalil et al. | 257/786 |
| 6,373,447 B1 | * | 4/2002 | Rostoker et al. | 343/895 |

FOREIGN PATENT DOCUMENTS

| | | | | |
|---|---|---|---|---|
| JP | 62-145764 | * | 6/1987 | 257/786 |
| JP | 03-263366 | | 11/1991 | |
| JP | 04-299565 | | 10/1992 | |
| JP | 62-230028 | * | 10/1997 | 257/786 |
| JP | 10-074625 | | 3/1998 | |
| JP | 11-177027 | | 7/1999 | |

* cited by examiner

Primary Examiner—Jasmine Clark
(74) Attorney, Agent, or Firm—Dellett & Walters

(57) ABSTRACT

A semiconductor device for forming a coil with a high inductance and a high Q value on a semiconductor substrate. A semiconductor device 10 comprises a rectangular semiconductor substrate 12, pads formed near four corners of this semiconductor substrate 12, pads 30 formed in the peripheral region along each side other than the corners, and a bonding wire 40 for connecting adjacent pads 20. The circulation of the bonding wire 40 along the periphery of the semiconductor substrate 12 with the pads 20 formed in the corners constitutes a coil.

8 Claims, 5 Drawing Sheets

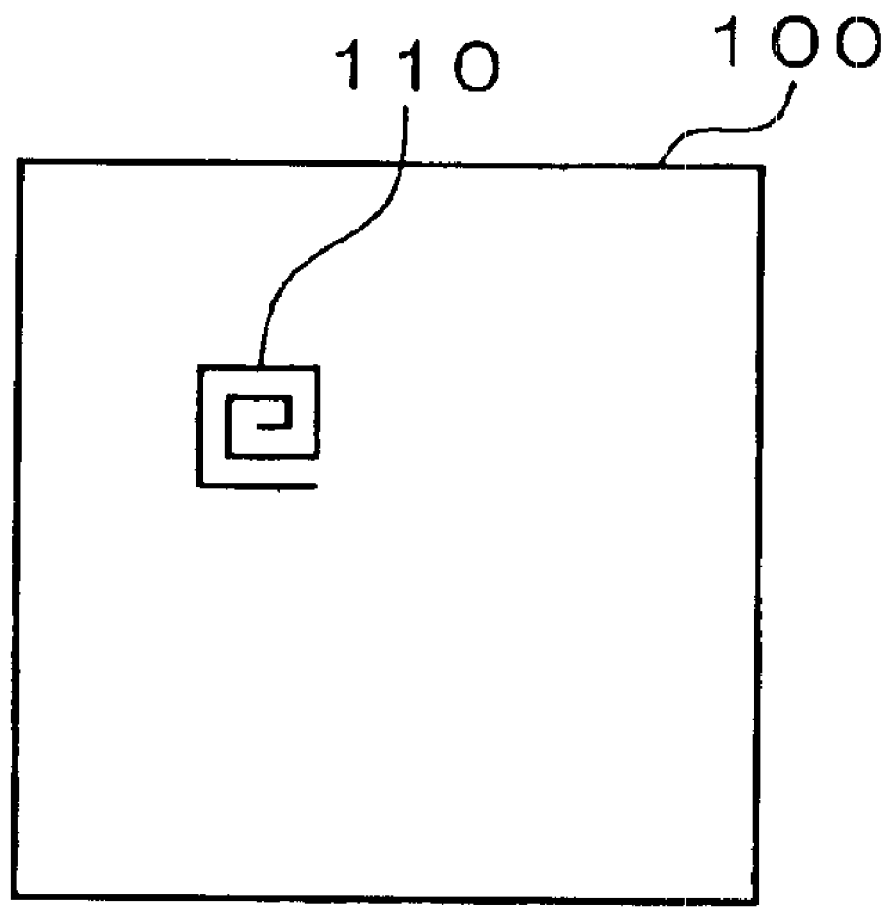

SEMICONDUCTOR DEVICE

TECHNICAL FIELD

The present invention relates to a semiconductor device having a coil and an antenna formed on a semiconductor substrate.

BACKGROUND ART

There is a known semiconductor circuit wherein a spiral pattern is formed on a semiconductor substrate by using a thin film forming technology and this pattern is utilized as a coil.

FIG. 7 is a diagram showing a specific embodiment of the coil formed on the semiconductor substrate. As shown in FIG. 7, a spiral coil 110 is formed with a metal pattern (thin film pattern of copper or gold for instance) on a surface of a semiconductor substrate 100. It is possible, by forming the coil 110 on the surface of the semiconductor substrate 100, to integrally form all the components such as an oscillator including the coil on the semiconductor substrate 100 and eliminate externally mounted components. It is thereby possible to reduce the number of components and simplify processes so as to significantly reduce cost.

Incidentally, in the case of forming the coil 110 on the semiconductor substrate 100 as mentioned above, there is a problem that a high inductance cannot be secured because a diameter of the coil 110 cannot be extended. There is also a problem that, as the semiconductor substrate exists immediately under the coil 110, an eddy current is generated on the surface of the semiconductor substrate and so a high Q value cannot be obtained.

DISCLOSURE OF THE INVENTION

The present invention was created in view of these points, and an object thereof is to provide a semiconductor device capable of forming a coil having a high inductance and a high Q value on a semiconductor substrate.

To solve the above-mentioned problem, the semiconductor device according to the present invention comprises a first pad formed in the proximity of a corner of a rectangular semiconductor substrate and a bonding wire of which at least one end is connected to the pad. It is possible, by using the first pad formed in the proximity of the corner of the semiconductor substrate, to extend the bonding wire to be used as the coil so as to obtain the high inductance. As the corner of the semiconductor substrate is generally empty space in which no pad is formed, it is possible, by forming the first pad by using this space, to effectively use the surface of the semiconductor substrate. The bonding wire is generally formed at a position a little distant from the surface of the semiconductor substrate, and so it is possible, in the case of using the bonding wire as the coil, to reduce an eddy current generated on the surface of the semiconductor substrate and obtain a high Q value.

It is desirable that the above-mentioned semiconductor substrate has a second pad to be used for internal circuit wiring in a peripheral region except the corner. It is possible, by placing the above-mentioned first pad in the corner of the semiconductor substrate and placing the second pad for internal circuit wiring in the other peripheral region, to form the first pad for forming the coil and the bonding wire to be connected to the first pad without decreasing the region for forming the second pad.

It is also desirable that the above-mentioned bonding wire is orbitally formed to make a continuous connection between two first pads corresponding to adjacent corners. It is possible, by making an orbital connection between the first pads formed in the corners, to obtain a high inductance against limited surface area of the semiconductor substrate.

In the case where a plurality of first pads are formed corresponding to one corner, it is desirable that the above-mentioned bonding wire is orbitally formed to make continuous and multiple connections between the two first pads corresponding to the adjacent corners. It is there by possible to form the coil of a still higher inductance.

In particular, it is desirable that the above-mentioned plurality of first pads formed corresponding to one corner are placed in an oblique direction against a side adjacent to this corner. It is possible, by placing the plurality of first pads formed in one corner in the oblique direction, to avoid mutual contact between adjacent bonding wires.

It is also desirable that the above-mentioned bonding wire is formed between the two first pads corresponding to the corner existing on a diagonal line of the rectangular shape. It is possible, by using the diagonally formed bonding wire, to form the coils of different inductances compared to the case of using the bonding wire formed along a periphery.

It is also desirable that the bonding wire connected to the above-mentioned first pad is formed after finishing formation of the other bonding wire to be connected to the second pad. It is thereby possible to form the coil just by lastly adding a process of forming the bonding wire corresponding-to the first pads so as to minimize changes in the processes.

It is also desirable that the coil for the antenna is formed by using the bonding wire connected to the above-mentioned first pad and this coil for the antenna is connected to a circuit formed on the semiconductor substrate. Thus, it is possible to form the coil for the antenna and the entire circuit connected thereto on the semiconductor substrate so as to reduce the component cost, manufacturing cost and so on by decreasing the number of components compared to the case of using the antenna as an externally mounted component.

It is also desirable that the coil for the inductor is formed by using the bonding wire connected to the above-mentioned first pad and this coil for the inductor is connected to the circuit formed on the semiconductor substrate. Thus, it is possible to form the coil for the inductor and the entire circuit connected thereto on the semiconductor substrate so as to reduce the component cost, manufacturing cost and so on by decreasing the number of components compared to the case of using the coil for the inductor as the externally mounted component.

BRIEF DESCRIPTION OF THE DRAWINGS

FIG. 7 is a diagram showing a specific embodiment of the coil formed on the semiconductor substrate.

BEST MODE FOR CARRYING OUT THE INVENTION

Figure 1:
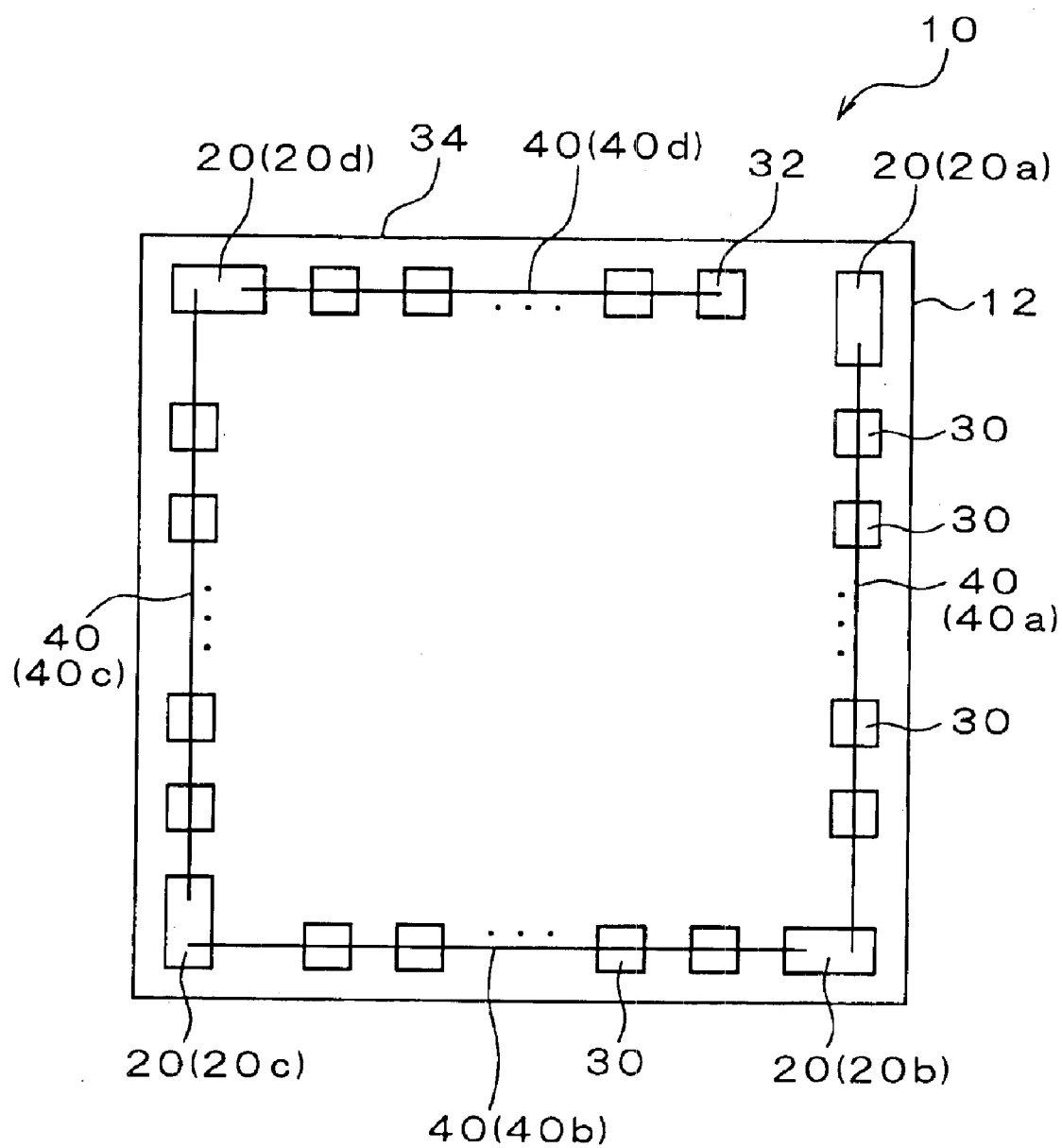
FIG. 1 is a plan view showing the semiconductor device according to this embodiment.

Hereafter, a semiconductor device according to an embodiment of the present invention will be described in detail by referring to the drawings.

Figure 2:
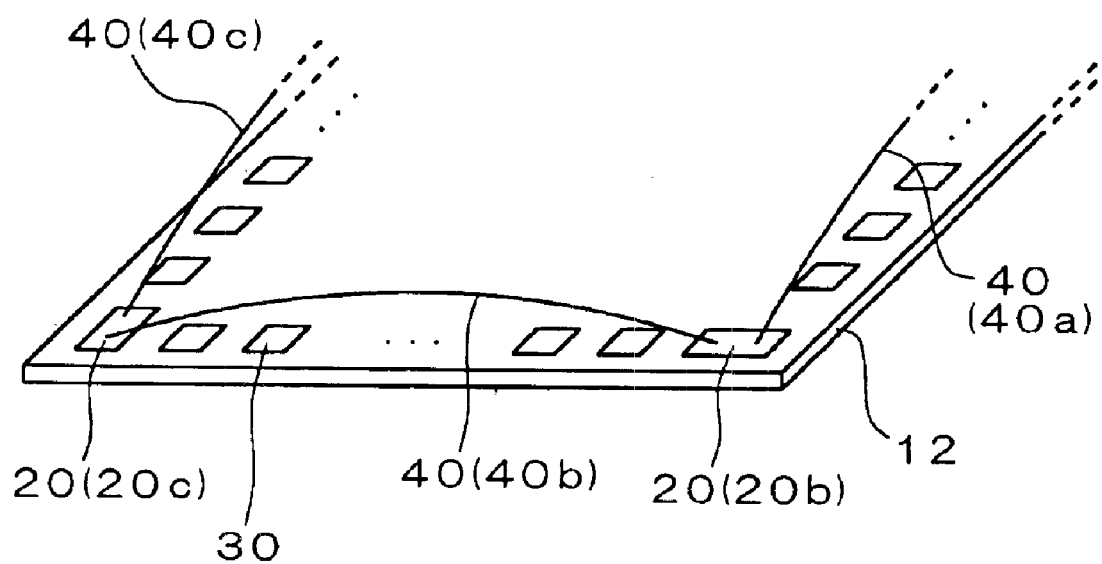
FIG. 2 is a partial perspective view of the semiconductor device shown in FIG. 1.

FIG. 1 is a plan view showing the semiconductor device according to this embodiment. And FIG. 2 is a partial perspective view of the semiconductor device shown in FIG. 1. As shown in these drawings, a semiconductor device 10 according to this embodiment is comprised of a rectangular semiconductor substrate 12, a plurality of pads 20 formed in the proximity of four corners of the rectangular semiconductor substrate 12, a plurality of pads 30 formed in a peripheral region along each side other than the corners, and bonding wires 40 for making connections between adjacent pads 20.

The bonding wires 40 make continuous connections between the two pads 20 formed at the adjacent corners. To be more precise, a pad 20a is formed on one corner and a pad 20b is formed in the corner adjacent to this corner respectively, and a bonding wire 40a is formed to make a connection between the two pads 20a and 20b. Also, a pad 20c is formed in the corner adjacent to the corner on which a pad 20b is formed, and a bonding wire 40b is formed to make a connection between the two pads 20b and 20c. Likewise, a pad 20d is formed in the corner adjacent to the corner on which the pad 20c is formed, and a bonding wire 40c is formed to make a connection between the two pads 20c and 20d. Furthermore, a pad 32 is formed between the pad 20a and 20d and in the proximity of the pad 20a, and a bonding wire 40d is formed to make a connection between the pads 20d and 32. Thus, one ends of the bonding wires 40a and 40d are terminated by the pads 20a and 32, and each of the bonding wires 40a, 40b, 40c and 40d is relayed by the pads 20b, 20c and 20d so that the coil almost making a round along the periphery of the semiconductor substrate 12 as a whole is formed.

Figure 3:
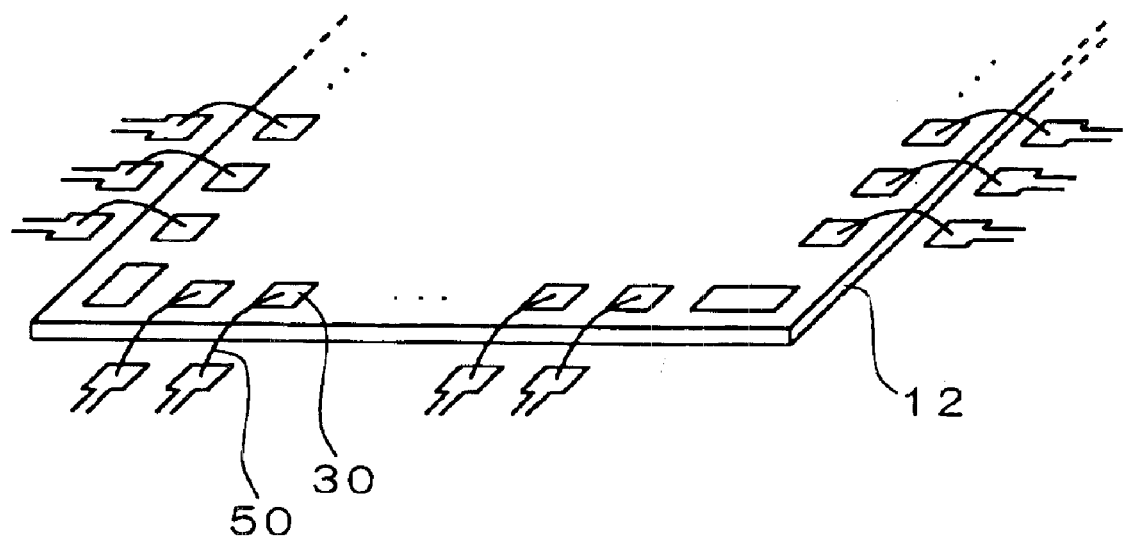
FIG. 3 is a diagram showing order of forming the bonding wires on the semiconductor device.

FIG. 3 is a diagram showing order of forming the bonding wires on the semiconductor device 10 of this embodiment. If the semiconductor device 10 of this embodiment is fixed at a predetermined position on a printed circuit board (not shown), wiring for the pad 30 formed in the peripheral region except the corner is performed first by wire bonding using a bonding wire 50 as shown in FIG. 3. This process is the same as the wire bonding process performed in the past. Next, as shown in FIGS. 1 and 2, the wiring is performed by the wire bonding for making a connection between the pads 20 or between the pads 20 and 32 provided on or in the proximity of the corner. The bonding wires 40 formed in this case are formed to jump over the space between the adjacent pads 20 or between the pads 20 and 32 so as to maintain a state of being clear of the pad 30 formed underneath them and the bonding wire 50 connected to the pad 30.

Incidentally, the coil formed by the above-mentioned bonding wire 40 may be used as the coil for an antenna. Thus, it is possible to form the coil for the antenna and a transmitting circuit, a receiving circuit and so on connected thereto as a whole on the semiconductor substrate 12 so as to reduce the component cost and manufacturing cost by decreasing the number of components compared to the case of using the antenna as an externally mounted component.

Otherwise, the coil formed by the above-mentioned bonding wire 40 may be used as the coil for an inductor. Thus, it is possible to form the coil for the inductor and an oscillator, a tuning circuit and so on connected thereto as a whole on the semiconductor substrate 12 so as to reduce the component cost and manufacturing cost by decreasing the number of components compared to the case of using a coil antenna for the inductor as an externally mounted component.

Thus, as the bonding wire 40 to be used as the coil is formed by using the pads 20 formed in the proximity of the four corners of the semiconductor substrate 12, it is possible to extend length of the bonding wire 40 against limited surface area of the semiconductor substrate 12 so as to obtain a high inductance.

As the corner of the semiconductor substrate 12 is generally empty space in which the pad 30 used for internal circuit wiring is not formed, it is possible, by forming the pad 20 to be used for forming the bonding wire 40 to be used as the coil by using this space, to effectively use the surface of the semiconductor substrate 12.

Furthermore, the bonding wire 40 is formed at a position a little distant from the surface of the semiconductor substrate 12, and so it is possible, in the case of using the bonding wire 40 as the coil, to reduce an eddy current generated on the surface of the semiconductor substrate 12 and obtain a high Q value.

The present invention is not limited to the above embodiment, but various modified embodiments are possible within the gist thereof. For instance, according to the above-mentioned embodiment, the bonding wire 40 is formed to almost make a round along the periphery of the semiconductor substrate 12. However, it may also be set to make a round less than once or twice or more.

Figure 4:
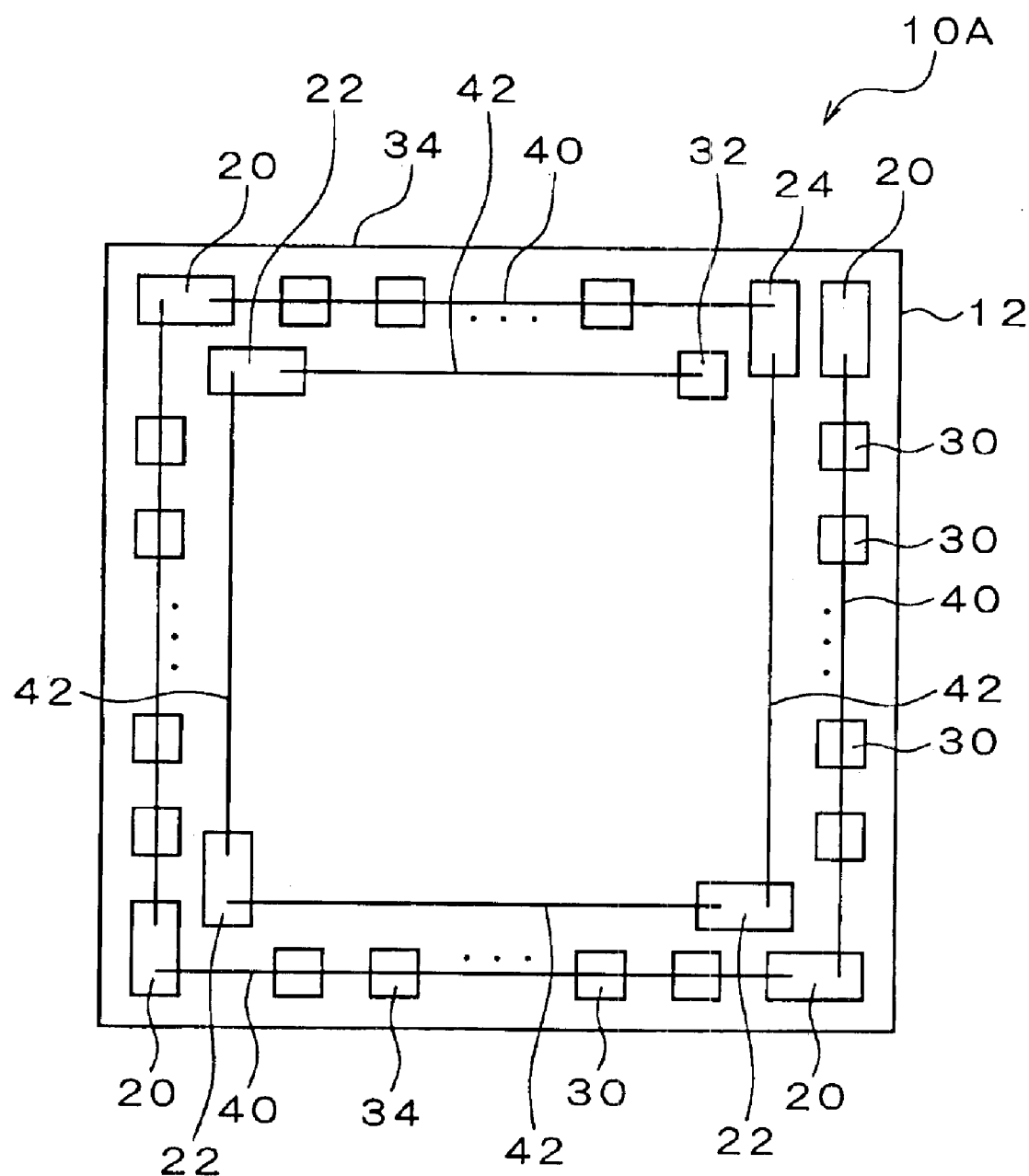
FIG. 4 is a plan view showing a semiconductor device on which the bonding wire is set to make a round twice.

FIG. 4 is a plan view showing a semiconductor device 10A on which the bonding wire 40 is set to make a round twice. As shown in FIG. 4, the pads 20, 24 and 32 are formed in the proximity of one corner of the semiconductor substrate 12. One of the two pads 20 and 32 is corresponding to the start of winding of the coil and the other is corresponding to the end thereof. The pad 24 has the bonding wire 40 constituting a peripheral coil connected to a bonding wire 42 constituting an inner coil, and makes a trunk connection between these coils.

The pads 20 and 22 are formed in the proximity of the other corners. The two pads 20 and 22 are placed in an oblique direction against a side adjacent to a corresponding corner. The pad 20 on one hand has two bonding wires 40 constituting the peripheral coil connected thereto, and relays them. The pad 22 on the other hand has two bonding wires 42 constituting the inner coil connected thereto, and relays them.

Thus, it becomes possible, by setting the bonding wire to make a round twice or more, to form the coil having a high inductance. As shown in FIG. 4, it is also possible, by placing the pads 20 and 22 in the oblique direction in the proximity of the corners, to prevent the peripheral coil and inner coil formed by relaying the pads 20 and 22 from overlapping so as to avoid mutual contact between the bonding wire 40 and the bonding wire 42.

According to the above-mentioned embodiment, the bonding wire 40 is formed along the periphery of the semiconductor substrate 12. However, it is also feasible to connect the pads 20 formed on the corners existing on a diagonal line of the rectangular semiconductor substrate 12 with the bonding wire.

Figure 5:
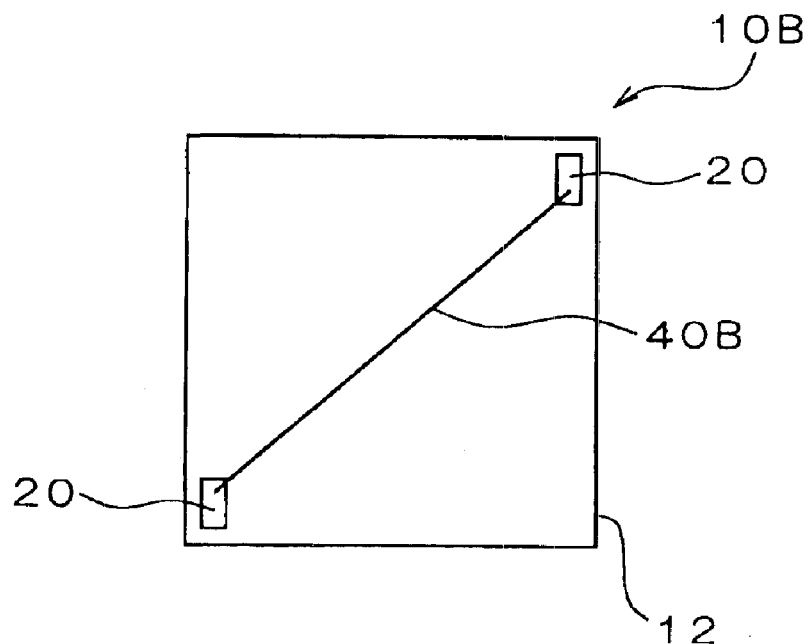
FIG. 5 is an overview plan view showing a semiconductor device having the coil making a connection between the two pads existing on the diagonal line of the semiconductor substrate via the bonding wire.

FIG. 5 is an overview plan view showing a semiconductor device 10B having the coil making a connection between the two pads 20 existing on the diagonal line of the semiconductor substrate 12 via the bonding wire 40B. As shown in FIG. 5, it is possible, by using the bonding wire formed along the diagonal line or combining this bonding wire with the bonding wire 40 shown in FIG. 1, to form the coil having an inductance different from that in the case of merely having the bonding wire 40 make a round along the periphery of the semiconductor substrate 12 so as to use it properly as required.

The above-mentioned embodiment described the case of forming one coil on the semiconductor substrate 12. However, it is also feasible to section the surface of the semiconductor substrate 12 so as to form two or more types of coils.

Figure 6:
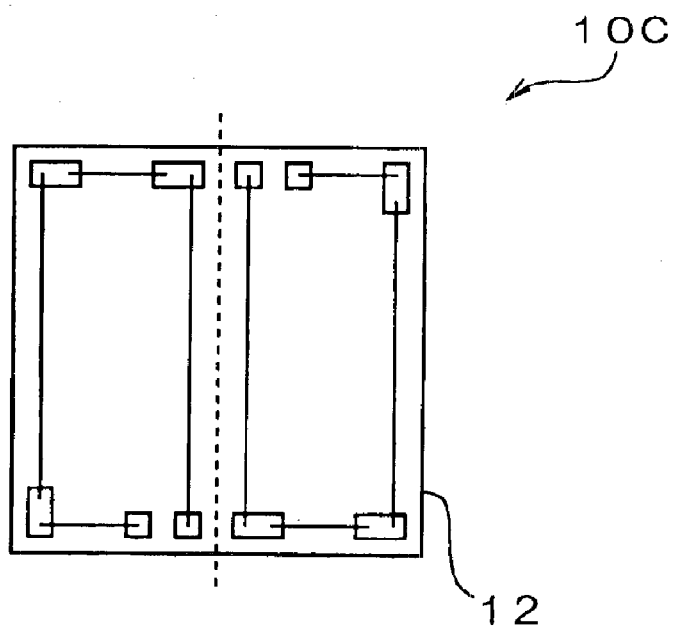
FIG. 6 is a plan view showing an overview configuration of a semiconductor device having two types of coils formed on the semiconductor substrate.

FIG. 6 is a plan view showing an overview configuration of a semiconductor device 10C having two types of coils formed on the semiconductor substrate 12. As shown in FIG. 6, it is possible, by assuming the case of dividing the surface of the semiconductor substrate 12 into two regions and separately forming the bonding wires along the periphery of the divided regions, to form the two types of coils. As for the thinkable cases of usage of these coils, one may be used as the coil for the antenna and the other as the coil for the inductor, or one may be used as the coil for the antenna for transmission and the other as the coil for the antenna for reception, for instance.

INDUSTRIAL APPLICABILITY

As described in detail above, according to the present invention, it is possible, by using the first pad formed in the proximity of the corner of the semiconductor substrate, to extend the bonding wire to be used as the coil so as to obtain the high inductance. As the corner of the semiconductor substrate is generally empty space in which no pad is formed, it is possible, by forming the first pad by using this space, to effectively use the surface of the semiconductor substrate. The bonding wire is generally formed at a position a little distant from the surface of the semiconductor substrate, and so it is possible, in the case of using the bonding wire as the coil, to reduce the eddy current generated on the surface of the semiconductor substrate and obtain a high Q value.

What is claimed is:

1. A semiconductor device comprising a first pad formed in the proximity of a corner of a rectangular semiconductor substrate and a bonding wire of which at least one end is connected to said first pad, characterized in that said semiconductor substrate has a second pad to be used for internal circuit wiring in a peripheral region except said corner.

2. The semiconductor device according to claim 1, characterized in that said bonding wire to be connected to said first pad is formed after finishing formation of the other bonding wire to be connected to said second pad.

3. A semiconductor device comprising a first pad formed in the proximity of a corner of a rectangular semiconductor substrate and a bonding wire of which at least one end is connected to said first pad, further comprising a second pad, characterized in that said bonding wire is orbitally formed to make a continuous connection between said first and said second pad corresponding to adjacent corners.

4. A semiconductor device comprising a first pad formed in the proximity of a corner of a rectangular semiconductor substrate and a bonding wire of which at least one end is connected to said first pad, characterized in that a plurality of said first pads are formed corresponding to said one corner, and said bonding wire is orbitally formed to make continuous and multiple connections between ones of said first pads.

5. The semiconductor device according to claim 4, characterized in that said plurality of first pads formed corresponding to said one corner are placed in an oblique direction against a side adjacent to this corner.

6. A semiconductor device comprising a first pad formed in the proximity of a corner of a rectangular semiconductor substrate and a bonding wire of which at least one end is connected to said first pad, further comprising a second pad, characterized in that said bonding wire is formed between said first and said second pads corresponding to corners existing on a diagonal line of said rectangular shape.

7. A semiconductor device comprising a first pad formed in the proximity of a corner of a rectangular semiconductor substrate and a bonding wire of which at least one end is connected to said first pad, characterized in that a coil for an antenna is formed by using said bonding wire connected to said first pad and this coil is connected to a circuit formed on said semiconductor substrate.

8. A semiconductor device comprising a first pad formed in the proximity of a corner of a rectangular semiconductor substrate and a bonding wire of which at least one end is connected to said first pad, characterized in that a coil for an inductor is formed by using said bonding wire connected to said first pad and this coil is connected to a circuit formed on said semiconductor substrate.

* * * * *